United States Patent
Zheng

(10) Patent No.: US 9,482,893 B2
(45) Date of Patent: Nov. 1, 2016

(54) LIQUID CRYSTAL DISPLAY PANEL AND MANUFACTURING METHOD THEREOF

(71) Applicant: Shenzhen China Star Optoelectronics Technology Co., Ltd., Shenzhen, Guangdong (CN)

(72) Inventor: Hua Zheng, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 99 days.

(21) Appl. No.: 14/404,685

(22) PCT Filed: Sep. 30, 2014

(86) PCT No.: PCT/CN2014/087932
§ 371 (c)(1),
(2) Date: Dec. 1, 2014

(87) PCT Pub. No.: WO2016/045141
PCT Pub. Date: Mar. 31, 2016

(65) Prior Publication Data
US 2016/0085113 A1  Mar. 24, 2016

(30) Foreign Application Priority Data
Sep. 24, 2014 (CN) .......................... 2014 1 0495732

(51) Int. Cl.
*G02F 1/1335* (2006.01)
*G03F 7/16* (2006.01)
*G03F 7/20* (2006.01)
*G03F 7/32* (2006.01)

(52) U.S. Cl.
CPC ... *G02F 1/133512* (2013.01); *G02F 1/133514* (2013.01); *G03F 7/16* (2013.01); *G03F 7/20* (2013.01); *G03F 7/325* (2013.01)

(58) Field of Classification Search
CPC .................. G02F 1/133512; G02F 1/133514; G03F 1/0053; G03F 7/70283
See application file for complete search history.

(56) References Cited

U.S. PATENT DOCUMENTS

| | | | |
|---|---|---|---|
| 2013/0155505 A1* | 6/2013 | Kim | G02B 27/2214 359/465 |
| 2014/0002776 A1* | 1/2014 | Kim | G02B 5/3083 349/106 |

FOREIGN PATENT DOCUMENTS

| CN | JP 2010008875 A | 11/2012 |
|---|---|---|
| CN | 104007575 A | 8/2014 |

* cited by examiner

*Primary Examiner* — Jessica M Merlin
(74) *Attorney, Agent, or Firm* — Andrew C. Cheng

(57) ABSTRACT

The present invention provides a liquid crystal display panel and manufacturing method thereof. The manufacturing method comprises: coating a photoresist layer; exposing the photoresist layer through a first mask and a second mask such that the black matrices with different widths are formed, wherein, along a direction extended from a middle area to a two-side area of the liquid crystal display panel, transmittances of the second transparent regions of the second mask are successively increased such that the width of the black matrices are successively increased. By doing so, the present invention makes the brightness displayed by the liquid crystal display panel be uniform such that the two-side whitening occurred while displaying on the liquid crystal display panel can be reduced or eliminated.

14 Claims, 2 Drawing Sheets

LIQUID CRYSTAL DISPLAY PANEL AND MANUFACTURING METHOD THEREOF

FIELD OF THE INVENTION

The present invention relates to the technique field of liquid crystal display, and more particularly to a liquid crystal display panel and manufacturing method thereof.

BACKGROUND OF THE INVENTION

When a TFT-LCD (Thin Film Transistor-Liquid Crystal Display) panel displays a low grey level image, there usually appears a poor display quality, so called as a two-side whitening, wherein the brightness in two-side area of the TFT-LCD is high and the brightness in the middle area of the TFT-LCD is low.

The reason why the two-side whitening occurred is that, as shown in FIG. 1, the driving voltage of the Gate line 11 is input from the scan driving electrode (Gate COF) 12 on the left and right side of the liquid crystal display panel 10, and the resistor R and capacitor C of the Gate line 11 results in RC delay, such that the voltage normally input from the two sides is distorted when it is transmitted to the middle area A, i.e. the Gate wave is distorted. The distorted voltage would reduce the charging ratio in the middle area A so that the brightness at the middle area A is lowered. At this time, the brightness at the two-side areas B1 and B2 is higher than the brightness at the middle area A, i.e. the two-side whitening occurs. The two-side whitening is more obviously when displaying a low grey level image due to sensitivity of human eyes.

SUMMARY OF THE INVENTION

Accordingly, the technique problem to be solved by the embodiments of the present invention is to provide a liquid crystal display panel and manufacturing method thereof, such that the brightness displayed by the liquid crystal display panel is uniform, and the two-side whitening occurred while displaying on the liquid crystal display panel can be reduced or eliminated.

In order to solve the technique problem mentioned above, a technique solution adopted by the present invention is to provide a manufacturing method of liquid crystal display panel, which comprises: coating a photoresist layer on a base; exposing the photoresist layer through a first mask and a second mask such that a plurality of black matrices with different widths are formed on the base, wherein the widths of the black matrices are successively increased along a direction extended from a middle area of the liquid crystal display panel to a two-side area of the liquid crystal display panel, a first exposing energy, which is greater than a second exposing energy, is provided for exposing the photoresist layer through the first mask and the second mask, and the second exposing energy is an exposing energy provided for exposing the photoresist layer through the first mask to form the black matrices with identical width; and removing the photoresist layer which is not exposed; wherein, the first mask comprises a plurality of first transparent regions, each of which is correspondence to a border area between two neighbored pixel electrodes of the liquid crystal display panel, and the second mask comprises a plurality of second transparent regions corresponding to the first transparent regions, and, along the direction extended from the middle area to the two-side area, transmittances of the second transparent regions are successively increased, the black matrices are with the same height and are in the second transparent regions correspondingly, and the width of each of the second transparent regions is greater than the width of the corresponded first transparent region.

Wherein, the widths of the first transparent regions are the same, and the widths of the second transparent regions are the same.

Wherein, the first mask is set between the second mask and the photoresist layer, and an area of the second mask is greater than or equals to the area of the liquid crystal display panel.

Wherein, a material for manufacturing the photoresist layer comprises a negative photoresist material.

Wherein, a developing technique is applied for removing the photoresist layer which is not exposed.

Wherein, the base is correspondence to a color filter substrate used for forming the liquid crystal display panel.

In order to solve the technique problem mentioned above, another technique solution adopted by the present invention is to provide a manufacturing method of liquid crystal display panel, which comprises: coating a photoresist layer on a base; exposing the photoresist layer through a first mask and a second mask such that a plurality of black matrices with different widths are formed on the base, wherein the widths of the black matrices are successively increased along a direction extended from a middle area of the liquid crystal display panel to a two-side area of the liquid crystal display panel; and removing the photoresist layer which is not exposed; wherein the first mask comprises a plurality of first transparent regions, each of which is correspondence to a border area between two neighbored pixel electrodes of the liquid crystal display panel, and the second mask comprises a plurality of second transparent regions corresponding to the first transparent regions, and, along the direction extended from the middle area to the two-side area, transmittances of the second transparent regions are successively increased.

Wherein, the black matrices are with the same height and are in the second transparent regions correspondingly, and the width of each of the second transparent regions is greater than the width of the corresponded first transparent region.

Wherein, the widths of the first transparent regions are the same, and the widths of the second transparent regions are the same.

Wherein, the first mask is set between the second mask and the photoresist layer, and an area of the second mask is greater than or equals to the area of the liquid crystal display panel.

Wherein, a first exposing energy, which is greater than a second exposing energy, is provided for exposing the photoresist layer through the first mask and the second mask, and the second exposing energy is an exposing energy provided for exposing the photoresist layer through the first mask to form the black matrices with identical width.

Wherein, a material for manufacturing the photoresist layer comprises a negative photoresist material.

Wherein, a developing technique is applied for removing the photoresist layer which is not exposed.

Wherein, the base is correspondence to a color filter substrate used for forming the liquid crystal display panel.

In order to solve the technique problem mentioned above, the other technique solution adopted by the present invention is to provide a liquid crystal display panel, which comprises a base and a black matrix with different width set on the base, wherein the width of the black matrix is successively increased along a direction extended from a middle area of the liquid crystal display panel to a two-side area of the liquid crystal display panel.

Wherein, the base is a color filter substrate of the liquid crystal display panel.

Wherein, a height of the black matrix is identical.

By applying the technique solution provided above, the beneficial effect of the embodiments of the present invention is: the embodiment of the present invention reduces the aperture ratio of the pixel and the transmittance of the pixel units in two-side areas by exposing the photoresist layer coated on the base through the first mask and the second mask and applying, along the direction extended from a middle area to a two-side area of the liquid crystal display panel, the second transparent regions with successively increased transmittances in the second mask to form black matrices with different widths along the direction extended from a middle area to a two-side area of the liquid crystal display panel on the base, such that the brightness at two-side areas could be reduced. At this time, the brightness difference between the two-side area and the middle area could be reduced or eliminated, the liquid crystal display panel displays uniform brightness, and the two-side whitening can be reduced or eliminated.

DETAILED DESCRIPTION OF PREFERRED EMBODIMENTS

The technique solutions in the embodiments of the present invention are described clearly and completely below with reference to the attached drawings of the embodiments of the present invention. Obviously, the embodiments described below are a part of embodiments but not all embodiments of the present invention. All other embodiments obtained by those have ordinary skill in the field based on the embodiments of the present invention without creative effort are within the protection scope of the present invention.

Figure 1:
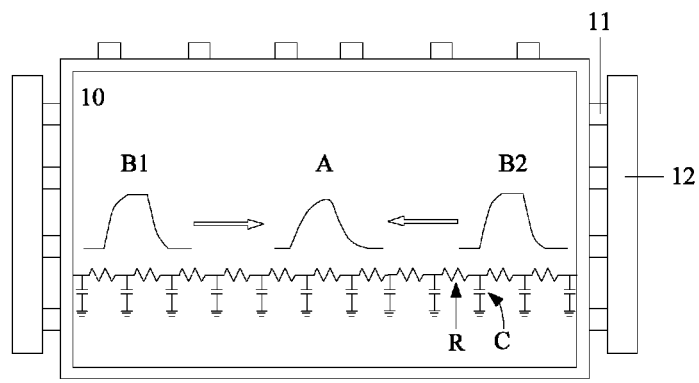
FIG. 1 is a structural top view of a conventional liquid crystal display panel.
Figure 2:
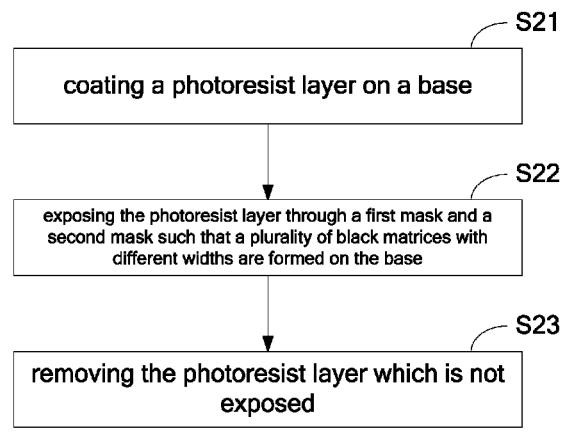
FIG. 2 is a flow chart of the manufacturing method of liquid crystal display panel according to a preferred embodiment of the present invention.

FIG. 2 is a flow chart of the manufacturing method of liquid crystal display panel according to a preferred embodiment of the present invention. As shown in FIG. 2, the manufacturing method of liquid crystal display panel comprises the step of:

Step S21: coating a photoresist layer on a base.

Figure 3:
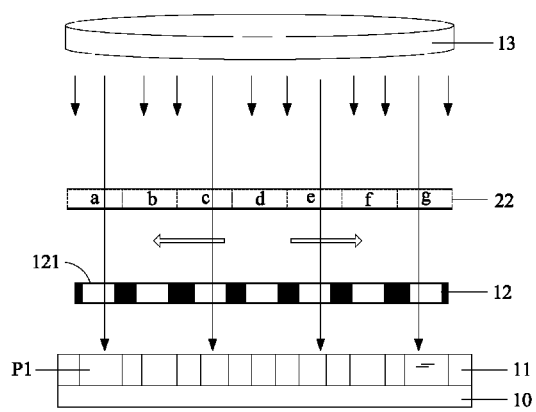
FIG. 3 is a schematic diagram showing exposing scene according to a preferred embodiment of the present invention.

Referring with FIG. 3, base 10 is correspondence to a color filter substrate which is used for forming the liquid crystal display panel, and could be a glass base, a plastic base or a flexible base. The photoresist layer 11 is uniformly coated on the base 10 and, preferably, the manufacturing material of the photoresist layer 11 is a negative photoresist material.

Step S22: exposing the photoresist layer through a first mask and a second mask such that a plurality of black matrices with different widths are formed on the base.

As shown in FIG. 3, the first mask 12 comprises a plurality of first transparent regions 121, each of which is correspondence to a border area between two neighbored pixel electrodes of the liquid crystal display panel, wherein the transmittances of the first transparent regions 121 are the same. The amount of the first transparent regions 121 shown in the figures, which is for taking as an example, is seven, and, preferably, the widths of the first transparent regions 121 are the same and the distance between the two neighbored first transparent regions 121 are the same in the present embodiment.

In the present embodiment, preferably, the first mask 12 is the conventional patterned mask for manufacturing black matrix (BM) on the color filter substrate. The procedure of manufacturing could be: marking the area where the black matrix of the liquid crystal display panel is or the area corresponding to a border area between two neighbored pixel electrodes of the array substrate firstly; after that, defining the first transparent regions 121 on the mask material according to the marks made by aforementioned marking, wherein the mask material is preferably a transparent hard material, such as glass or quartz, and the surface thereof is coated by an opaque metal layer, such as Cr, Al, Cu, Mo etc. and/or alloy film of these metals or combination of some of them; finally, the opaque layer corresponding to each first transparent region 121 is etched, and the proceeded processing, such as washing, etc. is performed so that the first mask 12 is produced. In order to ensure the exposure region during exposing, the mask material is preferably selected such that the area of first mask 12 is greater than or equals to the area of the liquid crystal display panel.

As shown in FIG. 3, the second mask 22 comprises a plurality of second transparent regions a, b, c, d, e, f and g corresponding to the first transparent regions 121, and the widths of the second transparent regions a, b, c, d, e, f and g are the same, wherein the width of each second transparent region is greater than the corresponding first transparent region 121. The amount of the second transparent regions shown in the figure, which is for taking as an example, is seven. Preferably, the second mask 22 in the present embodiment is an HTM (Half-Tone Mask) different from the conventional patterned mask, and, along the direction extended from the middle area of the liquid crystal display panel to the two-side areas of the liquid crystal display panel, i.e. the directions of the hollow arrow shown in FIG. 3, the transmittances of the second transparent regions a, b, c, d, e, f and g are successively increased, wherein the transmittance of the second transparent region a is greater than the transmittance of the second transparent region b, the transmittance of the second transparent region c is greater than the transmittance of the second transparent region d, the transmittance of the second transparent region e is greater than the transmittance of the second transparent region d, the transmittance of the second transparent region f is greater than the transmittance of the second transparent region e, and the transmittance of the second transparent region g is greater than the transmittance of the second transparent region f.

Furthermore, the transmittance difference between the two neighbored second transparent regions are identical, i.e. the transmittance difference between the second transparent region a and the second transparent region b, the second transparent region b and the second transparent region c, the second transparent region c and the second transparent region d, the second transparent region d and the second transparent region e, the second transparent region e and the second transparent region f, and the second transparent region f and the second transparent region g are identical.

The manufacturing procedure of the second mask 22 is basically the same as the manufacturing procedure of the first mask 12 described above.

Firstly, the area where the black matrix of the liquid crystal display panel is or the area corresponding to a border area between two neighbored pixel electrodes of the array substrate are marked. After that, the second transparent regions a, b, c, d, e, f and g on the mask material are defined according to the marks marked above, wherein the mask material could be the same as or different from the mask material for manufacturing the first mask 12, i.e. a transparent hard material, such as glass or quartz, and the surface thereof is coated by an opaque metal layer, such as Cr, Al, Cu, Mo etc. and/or alloy film of these metals or combination of some of them, or organic film layer such as polyurethane, PET (polyethylene terephthalate) or other high polymer. Finally, the opaque layer on the second transparent regions a, b, c, d, e, f and g is etched, and the proceeded processing, such as washing, etc. is performed so that the second mask 22 is produced. In order to ensure the exposure region during exposing, the mask material is preferably selected such that the area of second mask 22 is greater than or equals to the area of the liquid crystal display panel.

Please refer to FIG. 3 again, the base 10 coated by photoresist layer 11 is put into the exposure unit, and the second mask 22 is set between the light source 13 and the first mask 12, i.e. the first mask 12 is set between the second mask 22 and the photoresist layer 11. At this time, the first mask 12 is set and aligned above the photoresist layer 11, such that the first transparent regions 121 on the first mask 12 are aligned with the areas of the black matrices on the base 10, and the first transparent regions 121 are aligned with the second transparent regions a, b, c, d, e, f and g. After that, the light source 13 is turned on to proceed the exposure. Wherein, the light source 13 is preferable an UV (Ultraviolet) source, and the light (indicated by the black-solid arrow) used in the exposure is with a first exposing energy E1.

After transmitting the light with the first exposing energy E1 through the second transparent regions a, b, c, d, e, f and g with different transmittances, different exposing energies are generated correspondingly, such that the effective generated due to the exposure on the photoresist layer 11 is not identical after the light successively transmits through the second mask 22 and the first mask 12. For example, the transmittance $X_0$ of the second transparent region a and the second transparent region g is 100%, the transmittance $X_1$ of the second transparent region b and the second transparent region f is 90%, the transmittance $X_2$ of the second transparent region c and the second transparent region e is 80%, and the transmittance $X_3$ of the second transparent region d is 70%. After exposed by light with different exposing energy, insoluble substance is formed on the photoresist layer 11 made by negative photoresist material, i.e. black matrices P1 with different widths are formed at the regions corresponding to the area being exposed. Furthermore, the widths of the black matrices P1 are successively increased along the direction extended from the middle area to the two-side areas of the liquid crystal display panel, wherein as the transmittance of the second transparent regions getting higher, the width of the black matrix P1 formed correspondingly is getting greater. In the present embodiment, the height of the black matrices P1 are identical and each black matrix P1 is within a range limited by the corresponded second transparent region in the direction vertical to the base 10.

It is noted that, the first exposing energy E1 of the light for forming the black matrices P1 is greater than the second exposing energy E2 of the light for forming black matrices in the conventional process, i.e. E1>E2. Wherein, the second exposing energy E2 is the exposing energy for forming the black matrix with identical width by exposing the photoresist layer 11 through the first mask 11 only. In the embodiment, the second exposing energy E2 is preferred to be 70% of the first exposing energy, i.e. E2=E1*70%.

Step S23: removing the photoresist layer which is not exposed.

After finishing the steps described above, the photoresist layer which is not exposed is removed by applying a developing technique.

At this time, according to the common knowledge of the field of liquid crystal display, i.e. the transmittance of the pixel unit=aperture ratio*efficiency of liquid crystal (i.e. the transmittance of unit aperture area), it is noted that the aperture ratio of a pixel unit in an area corresponding to the black matrix P1 can be decreased by increasing the width of the black matrix P1. Accordingly, since the widths of the black matrices are successively increased along the direction extended from the middle area to the two-side areas of the liquid crystal display panel, it can be understood that the embodiment of the present invention reduces the aperture ratio at the two-side areas of the liquid crystal display panel such that brightness at the two-side areas can be reduced. At this time, the brightness difference between the two-side area and the middle area could be reduced or even be eliminated, the liquid crystal display panel displays uniform brightness, and the two-side whitening can be reduced or eliminated.

Figure 4:
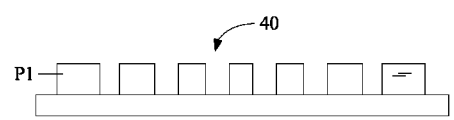
FIG. 4 is a sectional view of a color filter substrate manufactured by the manufacturing method shown in FIG. 2.
Figure 5:
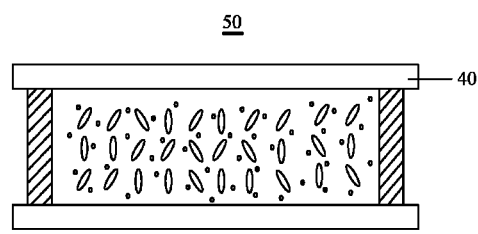
FIG. 5 is a sectional view of a liquid crystal display panel having the color filer substrate shown in FIG. 4.

The embodiments of the present invention further provide a color filter substrate 40 in FIG. 4, which is produced by the manufacturing method described above, and a liquid crystal display panel 50 in FIG. 5, which comprises the color filter substrate 40, such that the same technique effect could be provided thereby.

In summary, the embodiment of the present invention reduces the aperture ratio of the pixel and the transmittance of the pixel units in two-side areas by exposing the photoresist layer coated on the base through the first mask and the second mask and applying, along the direction extended from a middle area to a two-side area of the liquid crystal display panel, the second transparent regions with successively increased transmittances in the second mask to form black matrices with different widths along the direction extended from a middle area to a two-side area of the liquid crystal display panel on the base, such that the brightness at two-side areas could be reduced. At this time, the brightness difference between the two-side area and the middle area could be reduced or eliminated, the liquid crystal display panel displays uniform brightness, and the two-side whitening can be reduced or eliminated.

It is again noted that, the descriptions made above are the embodiments of the present invention, and are not used for limiting the protection scope of the present invention. All equivalent structures or flow variations made according to the contents of the specification and attached drawings of the present invention, such as combining technique features of the embodiments or applying, either directly or indirectly, them into other related technique fields, are included in the patent protection scope of the present invention.

What is claimed is:

1. A manufacturing method of liquid crystal display panel, wherein the manufacturing method comprises:

coating a photoresist layer on a base having two sides;

exposing the photoresist layer through a first mask and a second mask such that a plurality of black matrices with different widths are formed on the base, wherein the widths of the black matrices are successively increased along a direction extended from a middle area of the liquid crystal display panel to the two sides of the base of the liquid crystal display panel, a first exposing energy, which is greater than a second exposing energy, is provided for exposing the photoresist layer through the first mask and the second mask, and the second exposing energy is an exposing energy provided for exposing the photoresist layer through the first mask to form the black matrices with identical width; and removing the photoresist layer which is not exposed;

wherein, the first mask comprises a plurality of first transparent regions, each of which is in correspondence to a border area between two neighbored pixel electrodes of the liquid crystal display panel, and the second mask comprises a plurality of second transparent regions corresponding to the first transparent regions, and, along the direction extended from the middle area to the two sides of the base of the liquid crystal display panel, transmittances of the second transparent regions are successively increased, the black matrices are with the same height and are in the second transparent regions correspondingly, and the width of each of the second transparent regions is greater than the width of the corresponded first transparent region.

2. The manufacturing method according to claim 1, wherein the widths of the first transparent regions are the same, and the widths of the second transparent regions are the same.

3. The manufacturing method according to claim 1, wherein the first mask is set between the second mask and the photoresist layer, and an area of the second mask is greater than or equals to the area of the liquid crystal display panel.

4. The manufacturing method according to claim 1, wherein a material for manufacturing the photoresist layer comprises a negative photoresist material.

5. The manufacturing method according to claim 4, wherein a developing technique is applied for removing the photoresist layer which is not exposed.

6. The manufacturing method according to claim 1, wherein the base is correspondence to a color filter substrate used for forming the liquid crystal display panel.

7. A manufacturing method of liquid crystal display panel, wherein the manufacturing method comprises:

coating a photoresist layer on a base having two sides;

exposing the photoresist layer through a first mask and a second mask such that a plurality of black matrices with different widths are formed on the base, wherein the widths of the black matrices are successively increased along a direction extended from a middle area of the liquid crystal display panel to the two sides of the base of the liquid crystal display panel; and removing the photoresist layer which is not exposed;

wherein the first mask comprises a plurality of first transparent regions, each of which is in correspondence to a border area between two neighbored pixel electrodes of the liquid crystal display panel, and the second mask comprises a plurality of second transparent regions corresponding to the first transparent regions, and, along the direction extended from the middle area to the two sides of the base of the liquid crystal display panel, transmittances of the second transparent regions are successively increased.

8. The manufacturing method according to claim 7, wherein the black matrices are with the same height and are in the second transparent regions correspondingly, and the width of each of the second transparent regions is greater than the width of the corresponded first transparent region.

9. The manufacturing method according to claim 8, wherein the widths of the first transparent regions are the same, and the widths of the second transparent regions are the same.

10. The manufacturing method according to claim 8, wherein the first mask is set between the second mask and the photoresist layer, and an area of the second mask is greater than or equals to the area of the liquid crystal display panel.

11. The manufacturing method according to claim 7, wherein a first exposing energy, which is greater than a second exposing energy, is provided for exposing the photoresist layer through the first mask and the second mask, and the second exposing energy is an exposing energy provided for exposing the photoresist layer through the first mask to form the black matrices with identical width.

12. The manufacturing method according to claim 7, wherein a material for manufacturing the photoresist layer comprises a negative photoresist material.

13. The manufacturing method according to claim 12, wherein a developing technique is applied for removing the photoresist layer which is not exposed.

14. The manufacturing method according to claim 7, wherein the base is correspondence to a color filter substrate used for forming the liquid crystal display panel.

* * * * *